| United States Patent [19] | [11] Patent Number: 4,869,956 |
| Bridges et al. | [45] Date of Patent: Sep. 26, 1989 |

[54] POLYMER/COPPER LAMINATE AND METHOD FOR FABRICATION THEREOF

[75] Inventors: William G. Bridges, San Jose, Calif.; Thomas A. Armer, New Haven, Conn.

[73] Assignee: Olin Corporation, Cheshire, Conn.

[21] Appl. No.: 328,415

[22] Filed: Mar. 24, 1989

Related U.S. Application Data

[62] Division of Ser. No. 87,195, Aug. 20, 1987, Pat. No. 4,833,022.

[51] Int. Cl.$^4$ ............................................. B32B 15/00
[52] U.S. Cl. .................................. 428/336; 428/323; 428/458; 428/460; 428/462; 428/463
[58] Field of Search ............... 428/462, 463, 337, 458, 428/460, 323

[56] References Cited

U.S. PATENT DOCUMENTS

| 3,676,566 | 7/1972 | McBride | 174/36 |
| 4,424,095 | 1/1984 | Frisch et al. | 428/901 |

FOREIGN PATENT DOCUMENTS

2162124  1/1986  United Kingdom ............... 428/463

*Primary Examiner*—Edith Buffalow
*Attorney, Agent, or Firm*—Dale Lynn Carlson

[57] ABSTRACT

Polymer/copper laminates and a method for their manufacture employing smooth, untreated, wrought-copper and characterized by cohesive and adhesive strength in the resulting laminates.

13 Claims, No Drawings

POLYMER/COPPER LAMINATE AND METHOD FOR FABRICATION THEREOF

This application is a division, of application Ser. No. 07/087,195, filed Aug. 20, 1987 now U.S. Pat. No. 4,833,022.

FIELD OF THE INVENTION

This invention relates generally to polymer/copper laminates and a method for their manufacture; and, more particularly, to such laminates made from smooth, untreated, wrought-copper and characterized by cohesive and adhesive strength of the laminate layers.

BACKGROUND OF THE INVENTION

The fabrication of metal/polymer laminates for use in microcircuitry is a rapidly-evolving area of technology. In this field, copper is the metal of choice for providing a conductive surface for the circuit. Generally, the prior art has believed that pretreatment of the polymer and/or copper prior to forming the laminate, is necessary in order to enhance the physical bonding between the polymer and the copper at the polymer/copper interface. Typically, treated electrodeposited copper foil (commonly known as "treated ED foil") or treated wrought-copper foil is employed in laminate fabrication for microcircuitry. These forms of treated copper foil provide a surface roughness or etching into the copper foil to a depth of 0.0002 to 0.0005 inches for ED foil and 0.0001 to 0.0003 inches for wrought-copper foil. It is believed by the present inventors that the efficacy of bonding of polymer to these types of foils is based upon the formation of interstices and/or nodules on the foil surface which serve to anchor the polymer.

Attempts have been made in the past to use a separate adhesive layer or adhesion promoter in order to increase the adhesive and cohesive bonding strength thereof in the polymer/copper laminate. By way of illustration, U.K. Patent Application GB 2162124A, published on Jan. 29, 1986, discloses the use of an adhesive film of fluoropolymer/microglass to improve the bonding strength of a fluoropolymer-coated polyimide to copper foil. Although this U.K. patent application does not specify the type of copper foil used, the theory of "mechanical interlock" postulated at page 4, lines 10-12 thereof, suggests that the copper surface at the polymer/copper interface is pretreated to provide surface roughness, thus serving as a basis for mechanical interlock of the copper foil and with the polymer.

As an alternative or supplement to the use of an adhesion promoter or copper surface treatment, the prior art has utilized electrical discharge treatment of the surface of the polymer to be bonded to the copper to enhance the "cementability" of the polymer forming the laminate. For example, U.S. Pat. No. 3,676,566 discloses at column 5, lines 42-67 thereof, the use of electrical discharge in combination with a polyalkyleneimine adhesion promoter to enhance bonding in the laminate.

All of the above-described treatments of copper and/or polymer are expensive and increase laminate production time. Moreover, the use of an adhesion promoter adds to the laminate total materials cost and adds a separate and costly processing step in the fabrication of the laminates. Therefore, a new method of fabricating laminates without the need for pretreating the polymer or copper surfaces and which does not require a separate adhesion promoter would be highly desirable from a commercial standpoint.

SUMMARY OF THE INVENTION

The present invention relates to a polymer/copper laminate produced by a method comprising contacting a surface of smooth, untreated, wrought-copper with a surface of a layer of polymer under lamination conditions, said polymer being thermoplastic and free of an adhesion promoter, said method being free of any discharge (e.g. plasma, flame, corona or other electrical discharge) pretreatment of said surface of said layer of polymer prior to or during the lamination.

In another aspect, the present invention relates to a method for fabricating a polymer/copper laminate by contacting a surface of smooth, untreated, wrought-copper with a polymer layer free of surface electrical discharge pretreatment under lamination conditions sufficient to effect formation of said laminate.

These and other aspects will become apparent upon reading the following detailed description of the invention.

DETAILED DESCRIPTION OF THE INVENTION

It is well-known that polymers generally can utilize dipole-dipole, induced dipole, hydrogen, coordination, ionic or covalent bonding between the copper/copper oxide surface and the polymer. The present inventors hypothesize that the thermoplastic polymers preferred in the instant invention do not depend primarily on hydrogen bonding, as do epoxy compounds and polyimides. Thus, they are not susceptible to moisture degradation of the bond, and their bond strength and/or durability is greater than thermosetting resins and less preferred thermoplastic resins such as epoxy, polyacrylate, polyacetate, polyamides, or polyimide resins.

The thermoplastic polymers useful in the present invention are generally capable of forming chemical bonds with the crystalline metal, metal oxide or metal hydroxyl surface layers. Preferably, these chemical bonds are dispersive, Van de Waals, hydrogen bonds, ionic, coordination/chelation or covalent-type bonds. More preferably, the bonds are dipole-dipole, ionic, coordination/chelation or covalent, and most preferably, they are an ionic, covalent or coordination/chelation type of bond. Thus, the preferred polymers have low hydroxyl content but high local dipole moments. These polymers lend themselves to incorporation of functional groups on the backbone or pendant to the backbone which can chelate, coordinate, or form ionic or covalent bonds. In addition, the polymers should be stable to oxidative or thermal degradation in the presence of metal ions.

The laminate is fabricated by contacting the polymer layer(s) with the copper layer(s) at a temperature and pressure and for a time sufficient to allow contact and bonding of the copper and polymer interface(s) in the laminate.

As is well-known, adhesion is achieved by thermocompression at temperatures slightly above the $T_g$ or $T_m$ of the polymer. The peel strength of the resulting adhesive bonds depends on the lamination temperature and pressure and the exposure time to this pressure/temperature. Preferably, the lamination temperature is between 5° and 50° C. above the glass transition temperature or the melting point of the polymer. More preferably, only the surface layers of the polymer are melted while the bulk of the polymer remains solidified or just below the glass transition or melting point temperature. Most preferably, the polymer surface layer to a depth of between about 1 and about 10 microns is maintained at a temperature of between about 5° and about 50° C. higher than the $T_{GLASS}$ or $T_{MELT}$ during lamination while the bulk of the polymer substrate has a temperature of between about 5° and about 50° C. below $T_g$ or $T_m$. Preferably, the lamination temperature is between about 350° F. and about 800° F., more preferably between about 500° F. and about 800° F. Preferably, the lamination pressure employed is between about 1 psig and about 10,000 psig, more preferably between about 100 psig and about 5,000 psig, most preferably between about 300 psig and about 2,000 psig depending on the melt viscosity of the particular polymer selected and the lamination temperature utilized. The lamination time preferably is between about 0.01 and about 2.00 minutes, more preferably between about 0.1 and about 0.5 minutes, more preferably between about 0.1 and about 0.2 minutes. To effect the lamination, the copper and polymer layers are typically contacted in a hot press under the lamination conditions described herein. Alternately, this lamination can be carried out by fusion lamination between calendar rolls, or by continuous belt lamination.

The copper utilized in the present invention is generally smooth, untreated, wrought-copper, and can include copper foil (generally having a thickness of less than 20 mils, preferably between about 25 and about 50 microns), copper strip (generally having a thickness of between about 10 and about 20 mils), and copper sheet (generally having a thickness of greater than 10 mils). As used herein, the term "untreated" is intended to designate that the copper foil surface is not subjected to surface roughening treatment prior to lamination (although it may be subjected to a surface cleaning treatment or wash). This type of copper, when in the form of a foil, generally has a surface smoothness to a depth of between $1 \times 10^{-6}$ and $10.0 \times 10^{-6}$ inches. One advantage to using this type of foil in accordance with the present invention is that it is relatively inexpensive as compared to the cost of providing foils treated to provide a roughened copper surface.

It was noted by the present inventors and is believed to be significant that the peel strengths of laminates increased 40 percent to 100 percent when the smooth, untreated wrought-copper foils were washed by immersion in MeCl$_2$ (methylene chloride) for five seconds and then air dried prior to lamination of the copper to the polymer films. This solvent rinse probably removes the trace amounts of machine oils/greases in the surface grain structure of the "rolled" (wrought) copper foil and thereby prevents these oils from migrating to the laminate layer interface and interfering with the formation of an adhesive bond. Ultrasonic washing in methylene chloride improved adhesion by another 30 percent over washing (light agitation) by hand.

The copper foil layer(s) if used in the laminate can have a wide range of foil thickness of between about 0.1 and about 20.0 mils, more preferably between about 0.5 and about 10.0 mils, most preferably between about 1.0 and about 2.0 mils in thickness for each layer.

The polymer layer(s) utilized in the present invention generally provide the following desirable functional characteristics of: (a) binding the copper layers together preferably by chemical bonds, (b) providing an insulating dielectric barrier between the copper layers, and (c) maintaining a constant support and separation of the two copper layers. Additionally, the polymer layer can protect the copper surface from attack by corrosive agents, especially water and air. The preferred polymers for use in this invention are, in decreasing order of preference: perfluoroalkoxyvinyl ether copolymers (commercially available as TEFLON PFA, a product of E. I. Du Pont de Nemours & Company, Inc.), perfluorinated poly(ethylene-co-propylene) (commercially available as TEFLON FEP, a product of E. I. du Pont de Nemours & Company, Inc.), poly(ethylene-co-tetrafluoroethylene) (commercially available as TEFZEL, a product of E. I. du Pont de Nemours & Company, Inc.), liquid crystal polyarylester (commercially available as VECTRA, a product of Celanese or XYDAR, a product of Dartco), syndiotactic 1,2-polybutadiene, polyenamine, polycyanoarylethers, polyarylsulfones (commercially available as RADEL, a product of Amoco Chemical), polynorbornene (commercially available as NORSOREX, a product of CdF Chemie S.A.) and polyarylketones. Other useful thermoplastic polymers include: polyethersulfones, polyetherketones, polyetherimides, polyimides, polyarylalkylesters, polyphenyleneethers, atactic polybutadiene, polymers and copolymers of vinyl pyridine, and polyolefins grafted with carboxylic acid containing monomers, as well as fluorinated polymers, such as polyvinylfluoride (TEDLAR, a product of du Pont), polyvinylidene fluoride (SOLEF, a product of Solvay), and polychlorotrifluoroethylene (HALAR, a product of Allied Corporation). The above-specified copolymers can be made from a wide range of monomer ratios, generally a weight ratio of between 90 to 10 and 10 to 90 parts of one monomer to the other.

The polymer layer(s) in the laminate can have a wide range of thicknesses, preferably between about 0.5 and about 125 mils, more preferably between about 0.5 and about 10.0 mils, most preferably between about 1.0 and about 5.0 mils. A particularly suitable range of polymer layer thicknesses for electronics applications is between about 50 and about 150 microns.

In accordance with the present invention, good bonding of the above-described polymers to smooth wrough-copper is achieved without the requirement for a separate adhesive layer or polymer or metal treatment step.

Various additives can be incorporated into the polymers useful in the present invention. For example, solid fillers, pigments, lubricants, antioxidants and the like can be incorporated into the polymer, providing they do not degrade the polymer/copper bonding characteristics described above and associated with the present invention. In this regard, it is preferred that solid fillers not be employed at the polymer layer surface to be contacted with the copper foil since the fillers are generally expected to interfere with the desired bonding characteristics to the copper foil. If it is desired to use filled polymers, e.g. to provide dimensional stability, it is preferred that an intermediate layer of unfilled polymer be used at the polymer/copper interface. In this regard, it is preferred that the additives, fillers, lubricants, plasticizers, stabilizers, and coupling agents which are added to the bonding layer are contained by the polymer matrix and kept sufficiently immobile so as not to migrate to the metal-polymer interface and cause a weakening of the metal-polymer adhesive bond or form a weak boundary layer in the polymer adjacent to the interface.

For filled laminates, it is expected that a filler level of up to about the critical packing volume fraction of the filler will not adversely affect adhesion properties, and that a minimum of 30%–40% volume fraction is generally necessary to provide dimensional stability.

Multilayer A-B-A type polymer films may be employed to enhance physical properties such as dimensional stability or coefficient of thermal expansion or to minimize cost by using a less costly "B" layer and using an "A" layer for its adhesive properties to smooth, untreated, wrought foils.

The following examples are intended to illustrate, but in no way limit the scope of, the present invention. For these examples, sheets of polymeric resin core were prepared from resin granules using well-known compression molding techniques on a sheet extruder. Laminates made using various commercial polymers and methylene chloride-washed (as described above) smooth, untreated, wrought-copper were fabricated in a thermocompression molder at a temperature and pressure and for a time as specified in the examples. Peel strength tests on the laminates fabricated as disclosed in these examples were conducted in accordance with the Institute for Interconnecting and Packaging Electronic Circuits (IPC) Test Method No. 2.4.9, Revision A, dated December 1982, the contents of which are incorporated herein by reference. In short, this test involves masking the foil with ⅛ inch wide strips, then etching away the unmasked, exposed metal. The remaining, ⅛ inch wide metal/polymer laminate strips are mounted into an Instron test jig and peeled apart at a 90° angle. The force required to peel the sample apart is recorded and the lowest value is reported as a force per inch of strip width.

EXAMPLES 1–7

Preparation and Testing of Various Polymer/Copper Laminates

EXAMPLE 1

A sheet of pure TEFLON PFA 340 fluoropolymer film, 0.005" thick, as purchased from E. I. Du Pont de Nemours and Company, was positioned between two "1-ounce" copper skin layers of smooth, untreated, wrought-copper foil. The resulting assembly was placed in a molding press and was soaked at a temperature of 650° F. for a period of 300 seconds under a pressure of 235 psig. The pressure in the mold was then increased to 2500 psig and held for 30 seconds. The press was opened, the laminated assembly removed and allowed to cool to room temperature. The laminate was masked, etched, and peeled according to the IPC test method referenced above. The resulting peel strength was greater than 5 pounds per inch.

EXAMPLE 2

A sheet of pure TEFLON FEP 100N fluoropolymer film, 0.005" thick, as purchased from E. I. du Pont de Nemours and Company, was positioned between two "1-ounce" copper skin layers of smooth, untreated, wrought-copper foil. The resulting assembly was placed in a molding press and was soaked at a temperature of 675° F. for a period of 300 seconds under a pressure of 235 PSI. The pressure in the mold was then increased to 1875 PSI and held for 30 seconds. The press was opened, the laminated assembly removed and allowed to cool to room temperature. The resulting laminate was masked, etched, and peeled according to the above-referenced IPC test, yielding a peel strength of greater than 5 pounds per inch.

EXAMPLE 3

A sheet of pure TEFZEL PE-TFE 500LZ poly(ethylene-co-tetrafluoroethylene) fluoropolymer film, 0.005" thick, as purchased from E. I. du Pont de Nemours and Company, was positioned between two "1-ounce" copper skin layers of smooth, untreated, wrought-copper foil. The resulting assembly was placed in a molding press and was soaked at a temperature of 650° F. for a period of 100 seconds under a pressure of 80 PSI. The pressure in the mold was then increased to 560 PSI and held for 30 seconds. The press was opened, the laminated assembly removed and allowed to cool to room temperature. The resulting laminate was masked, etched, and peeled according to the above-referenced IPC test, yielding a peel strength of greater than 5 pounds per inch.

EXAMPLE 4

Sheets of pure liquid crystalline polyester (VECTRA A900 series from Celanese Corporation) were formed by well-known compression molding techniques. A sheet of this material, approximately 5 mils thick, was placed between two skin layers of "1-ounce" smooth, untreated, wrought-copper foil. The resulting assembly was placed in a molding press and soaked at a temperature of 640° F. for 300 seconds at a pressure of 30 psig. The pressure the mold was then increased to 2100 psig and held for 30 seconds. The press was then opened, the laminated assembly was removed and allowed to cool to room temperature. The resulting laminate was masked, etched, and peeled according to the above-referenced IPC test, yielding a peel strength of greater than 5 pounds per inch.

EXAMPLE 5

Sheets of pure syndiotactic 1,2-polybutadiene (RB 830 from Japan Synthetic Rubber Company) were prepared from resin granules using well-known compression molding or cast-film extrusion techniques. A sheet of this material approximately 5 mils thick was positioned between two "1-ounce" copper skin layers of smooth, untreated, wrought-copper foil. The resulting assembly was placed in a molding press and was soaked at a temperature of 500° F. for a period of 100 seconds under a pressure of 60 PSI. The pressure in the mold was then increased to 1250 PSI and held for 30 seconds. The press was opened, the laminated assembly was removed and allowed to cool to room temperature. The resulting laminate was masked, etched, and peeled according to the above-referenced IPC test, yielding a peel strength of greater than 2.0 pounds per inch.

EXAMPLE 6

TEFLON PFA 350 or TEFLON PFA 340, perfluoroalkoxyvinyl ether copolymer from E. I. du Pont de Nemours and Company was compounded with fumed silica in the weight ratio 30 parts silica to 70 parts polymer, using a twin screw extruder operating at 680° F., and practicing well-known compounding extrusion techniques. The extrudate was pelletized then dried in a hopper dryer for 24 hours at 350° F. Sheets of the silica filled TEFLON PFA were formed by using well-known compression molding techniques. A sheet of this material, approximately 5 mils thick, was placed between two sheets of "1-ounce" smooth, untreated, wrought-copper foil. The resulting assembly was placed in a molding press and soaked at a temperature of 680° F. for 300 seconds at a pressure of 30 psig. The pressure in the mold was then increased to 1875 psig and held for 30 seconds. The press was then opened, the laminated assembly was removed and allowed to cool to room temperature. The resulting laminate was masked, etched, and peeled according to the above-referenced IPC test, yielding a peel strength of greater than 3 pounds per inch.

EXAMPLE 7

TEFLON PFA 350 or TEFLON PFA 340, perfluoroalkoxyvinyl ether copolymer from E. I. du Pont de Nemours and Company was compounded with fumed silica in the weight ratio of 30 parts silica to 70 parts polymer, using a twin screw extruder operating at 680° F., and practicing well-known compounding extrusion techniques. The extrudate was pelletized then dried in a hopper dryer for 24 hours at 350° F. Sheets of the silica filled PFA were formed by using well-known compression molding techniques. A sheet of this material, approximately 3 mils thick was placed between two 1.0 mil thick sheets of pure TEFLON PFA 340 or 350. This three layer assembly, approximately 5 mils thick, was placed between two sheets of "1-ounce" smooth, untreated wrought-copper foil. The resulting five layer assembly was placed in a molding press and soaked at a temperature of 680° F. for 600 seconds at a pressure of 30 psig. The pressure in the mold was then increased to 1875 psig and held for 60 seconds. The press was then opened, the laminated assembly was removed, and allowed to cool to room temperature. The resulting laminate was masked, etched, and peeled according to the above-referenced IPC test, yielding a peel strength greater than 5 pounds per inch.

EXAMPLE 8

Preparation and Testing of a Five-Layer Laminate Using Multi-Layer Polymer Film

Although poly(phenylene sulfide) does not adhere to smooth, washed, wrought-copper foil, it does adhere to PFA, as shown in this example. Therefore, the poly(phenylene sulfide) can be used as the "B" inner layer in an A-B-A type multilayer film, with PFA as the "A" layer providing good adhesion to smooth, washed, wrought-copper. The use of materials such as poly(phenylene sulfide) is expected to greatly reduce material cost (due to the cheapness of these materials) without significantly adversely affecting the electrical performance or mechanical strength of the finished laminate.

RYTON R3, glass filled poly(phenylene sulfide) from Phillips Chemical composed of approximately 30 parts glass to 70 parts polymer was formed into sheets using well-known compression molding techniques. A sheet of this material, approximately 3 mils thick was placed between two 1.0 mil thick sheets of pure TEFLON PFA 340 or 350. This three layer assembly, approximately 5 mils thick, was placed between two sheets of "1-ounce" smooth, untreated, wrought-copper foil. The resulting five layer assembly was placed in a molding press and soaked at a temperature of 680° F. for 600 seconds at a pressure of 30 psig. The pressure in the mold was then increased to 1875 psig and held for 60 seconds. The press was then opened, the laminated assembly was removed and allowed to cool to room temperature. The resulting laminate was masked, etched, and peeled according to the above-referenced IPC test, yielding a peel strength of greater than 5 pounds per inch.

As a further specific example (see EXAMPLE 9) it was shown that PFA adheres to FEP and so FEP or "filled FEP" can be utilized as the "B" layer in an A-B-A type multilayer polymer film.

EXAMPLE 9

Preparation of Another Five-Layer Laminate

TEFZEL 500LZ, poly(ethylene-co-tetrafluoroethylene) from E. I. du Pont de Nemours and Company was compounded with fumed silica in the weight ratio 30 parts silica to 70 parts polymer, using a twin screw extruder operating at 680° F., and practicing well-known compounding extrusion techniques. The extrudate was pelletized then dried in a hopper dryer for 24 hours at 350° F. Sheets of the silica filled TEFZEL were formed by using well-known compression molding techniques. A sheet of this material, approximately 3 mils thick was placed between two 1.0 mil thick sheets of pure TEFLON PFA 340 or 350. This three layer assembly, approximately 5 mils thick, was placed between two sheets of "1-ounce" smooth, untreated, wrought-copper foil. The resulting five layer assembly was placed in a molding press and soaked at a temperature of 680° F. for 600 seconds at a pressure of 30 psig. The pressure in the mold was then increased to 2100 psig and held for 60 seconds. The press was then opened, and the laminated assembly was removed and allowed to cool to room temperature. The resulting laminate was masked, etched, and peeled according to the above-referenced IPC test, yielding a peel strength of greater than 5 pounds per inch.

EXAMPLES 10-12

Preparation of Other Polymer/Copper Laminates

EXAMPLE 10

Sheets of pure polynorbornene (NORSOREX N from CdF Chemie S.A.) were formed by using well-known compression molding or cast-film extrusion techniques. A sheet of this material, approximately 5 mils thick, was placed between two sheets of "1-ounce", smooth, untreated, wrought-copper foil. The resulting assembly was placed in a molding press and soaked at a temperature of 520° F. for 300 seconds at a pressure of 30 psig. The pressure in the mold was then increased to 2100 psig and held for 30 seconds. The press was then opened, the laminated assembly was removed and allowed to cool to room temperature. The resulting laminate was masked, etched, and peeled according to the above-referenced IPC test, yielding a peel strength of greater than 2 pounds per inch.

EXAMPLE 11

Sheets of pure polyarylsulfone (RADEL A-400 from Amoco Chemical) were formed by using well-known compression molding or cast-film extrusion techniques. A sheet of this material, approximately 5 mils thick, was placed between two sheets of "1-ounce", smooth, untreated, wrought-copper foil. The resulting assembly was placed in a molding press and soaked at a temperature of 700° F. for 300 seconds at a pressure of 30 psig. The pressure in the mold was then increased to 1860 psig and held for 30 seconds. The press was then opened, the laminated assembly was removed and allowed to cool to room temperature. The resulting laminate was masked, etched, and peeled according to the above-referenced IPC test, yielding a peel strength of greater than 2 pounds per inch.

Thus, in accordance with the present invention, TEFLON PFA, TEFLON FEP, TEFZEL, polynorbornene, syndiotactic 1,2-polybutadiene, liquid crystal polyarylesters (and, to a lesser extent PTFE see EXAMPLE 12 below) are thermoplastics with excellent adhesion to untreated copper-wrought foil. Since there is essentially no surface roughness on the copper foil, the present inventors speculate that the adhesion mechanism must be chemical in nature and not merely a mechanical bonding.

In contrast, conventional high performance thermosetting resins such as epoxy and bismaleimide, exhibits poorer adhesion to smooth, wrought-copper, see COMPARATIVE EXAMPLES A and B which follow.

EXAMPLE 12

Skived sheets of pure TEFLON-PTFE (a product of E. I. du Pont de Nemours and Company) were purchased from a commercial supplier. A sheet of this material, approximately 3 mils thick, was placed between two sheets of "1-ounce" smooth, untreated, wrought-copper foil. The resulting assembly was placed in a molding press and soaked at a temperature of 700° F. for 300 seconds at a pressure of 30 psig. The pressure in the mold was then increased to 2100 psig and held for 30 seconds. The press was then opened, the laminated assembly was removed and allowed to cool to room temperature. The resulting laminate was masked, etched, and peeled according to the above-referenced IPC test, yielding a peel strength of less than 1 pound per inch.

COMPARISON EXAMPLES

Preparation and Testing of Thermosetting Polymer/Copper Laminates

COMPARATIVE EXAMPLE A

EPON 828 (diglycidalether bisphenolacetone) epoxy resin from Shell Oil Company was mixed with TETA (triethylenetetraamine in the ratio of 11 parts epoxy to 1 part TETA). This mixture was applied in a thickness of 0.005" to a sheet of "1-ounce" smooth, untreated, wrought-copper foil, using a doctor blade applicator. A second sheet of copper foil was laid on top of the epoxy mixture and the whole assembly was cured in a press at 160° C. for 3 hours under 5 psig pressure. The press was then opened, the laminated assembly was removed and allowed to cool to room temperature. The resulting laminate was masked, etched and peeled according to the above-referenced IPC test, yielding a peel strength of less than 0.8 pounds per inch.

COMPARATIVE EXAMPLE B

KERIMIDE 1050 bismaleimide resin from Rhone-Poulenc was mixed with Curethane (methylenedianiline) in the ratio of 2 parts Kerimide to 1 part Curethane. The mixture was dissolved in N-methylpyrrolidone to make a 50 weight percent solution. The solution was applied in a thickness of 0.005" to a sheet of "1-ounce" smooth, untreated, wrought-copper foil, using a doctor blade applicator and heated in a vacuum oven at 60° C. for 12 hours to flash the solvent. A second sheet of copper foil was laid on top of the resin mixture and the whole assembly was cured in a press at 270° C. for 4 hours under 5 psig pressure. The press was then opened, the laminated assembly was removed and allowed to cool to room temperature. The resulting laminate was masked, etched, and peeled according to the above-referenced IPC test, yielding a peel strength less than 0.6 pounds per inch.

What is claimed is:

1. A polymer/copper laminate produced by a method comprising contacting a surface of smooth, untreated, wrought-copper with a surface of a layer of polymer under lamination conditions, said polymer being selected from the group consisting of: liquid crystal polyarylester, syndiotactic 1,2-polybutadiene, polyenamine, polycyanoarylethers, polyarylsulfones, polynorbornene and polyarylketones, said method being free of any discharge pretreatment of said surface of said layer of polymer prior to or during the lamination.

2. The laminate of claim 1 wherein said polymer is syndiotactic 1,2-polybutadiene or polyarylsulfones.

3. The laminate of claim 1 wherein said smooth, wrought-copper has a thickness of between about 25 and about 50 microns.

4. The laminate of claim 1 wherein said layer of polymer has a thickness of between about 50 and about 150 microns.

5. The laminate of claim 1 wherein said layer of polymer is free of filler at said surface thereof but additionally contains a filler in an interior portion of said layer of polymer.

6. The laminate of claim 5 wherein said filler is selected from the group consisting of: fumed $SiO_2$, glass fibers, ceramic particles, fibers, particles, whiskers and beads of fumed $SiO_2$, glass, ceramics, and polyaramid.

7. A method for fabricating a polymer/copper laminate by contacting a surface of a smooth, untreated, wrought-copper with a polymer layer selected from the group consisting of: liquid crystal polyarylester, syndiotactic 1,2-polybutadiene, polyenamine, polycyanoarylethers, polyarysulfones, polynorbornene and polyarylketones, said polymer being free of any surface discharge pretreatment, said contacting being conducted under lamination conditions sufficient to effect formation of said laminate.

8. The method of claim 7 wherein said polymer is syndiotactic 1,2-polybutadiene or polyarylsulfones.

9. The method of claim 7 wherein said smooth, wrought-copper has a thickness of between about 25 and about 50 microns.

10. The method of claim 7 wherein said polymer layer is free of filler at said surface thereof but additionally contains a filler in an interior portion of said layer of polymer.

11. The method of claim 23 wherein said filler is selected from the group consisting of: fumed $SiO_2$, glass fibers, ceramic particles, fibers, particles, whiskers and beads of fumed $SiO_2$, glass, ceramics, and polyaramid.

12. The method of claim 7 wherein said contacting is carried out at a temperature of between about 350° F. and about 800° F.

13. The method of claim 7 wherein said contacting is carried out at a pressure of between about 1 psig and about 10,000 psig.

* * * * *

UNITED STATES PATENT AND TRADEMARK OFFICE
CERTIFICATE OF CORRECTION

PATENT NO. : 4,869,956

DATED : September 26, 1989

INVENTOR(S) : Bridges et al

It is certified that error appears in the above—identified patent and that said Letters Patent is hereby corrected as shown below:

In Column 10, at line 55 delete "23" and insert --10--.

Signed and Sealed this

Second Day of June, 1992

Attest:

DOUGLAS B. COMER

*Attesting Officer*   *Acting Commissioner of Patents and Trademarks*